(12) United States Patent
Atsuji et al.

(10) Patent No.: US 11,926,570 B2
(45) Date of Patent: Mar. 12, 2024

(54) COMPOSITE SINTERED BODY, SEMICONDUCTOR MANUFACTURING APPARATUS MEMBER, AND METHOD OF PRODUCING COMPOSITE SINTERED BODY

(71) Applicant: NGK INSULATORS, LTD., Nagoya (JP)

(72) Inventors: Kyohei Atsuji, Nagoya (JP); Keita Miyanishi, Anjo (JP); Asumi Nagai, Okazaki (JP); Hirofumi Yamaguchi, Kasugai (JP)

(73) Assignee: NGK INSULATORS, LTD., Nagoya (JP)

( * ) Notice: Subject to any disclaimer, the term of this patent is extended or adjusted under 35 U.S.C. 154(b) by 167 days.

(21) Appl. No.: 17/445,504

(22) Filed: Aug. 20, 2021

(65) Prior Publication Data

US 2022/0081365 A1    Mar. 17, 2022

(30) Foreign Application Priority Data

Sep. 15, 2020  (JP) .................. 2020-154641

(51) Int. Cl.
*C04B 35/119*        (2006.01)
*C04B 35/48*         (2006.01)
(Continued)

(52) U.S. Cl.
CPC .......... *C04B 35/119* (2013.01); *C04B 35/48* (2013.01); *C04B 35/62665* (2013.01);
(Continued)

(58) Field of Classification Search
CPC . C04B 35/117; C04B 35/119; C04B 35/5626;
C04B 35/48; C04B 35/62665; C04B 35/11; C04B 35/645; C04B 2235/6567; C04B 2235/6562; C04B 2235/96; C04B 2235/404; C04B 2235/80; C04B 2235/5445; C04B 2235/6565; C04B 2235/3206; C04B 2235/658; C04B 2235/3217; C04B 2235/9607;
(Continued)

(56) References Cited

U.S. PATENT DOCUMENTS 6,351,367 B1   2/2002  Mogi et al.
6,929,874 B2   8/2005  Hiramatsu et al.
(Continued)

FOREIGN PATENT DOCUMENTS

CN    105980331 A    9/2016
JP    2005-343733 A  12/2005
(Continued)

OTHER PUBLICATIONS

Machine translation of Cho et al. Korean Patent Document KR 10-0648001 B1 Nov. 23, 2006 (Year: 2006).*
(Continued)

*Primary Examiner* — Kevin J Comber
(74) *Attorney, Agent, or Firm* — BURR PATENT LAW, PLLC

(57) ABSTRACT

A composite sintered body includes a base material that includes ceramic as a main component, and an electrode arranged inside the base material or on a surface of the base material. The electrode contains W and $ZrO_2$.

10 Claims, 2 Drawing Sheets

(51) Int. Cl.
*C04B 35/626* (2006.01)
*C04B 35/645* (2006.01)
*H01L 21/683* (2006.01)

(52) U.S. Cl.
CPC ........ *C04B 35/645* (2013.01); *H01L 21/6833* (2013.01); *C04B 2235/404* (2013.01); *C04B 2235/96* (2013.01); *C04B 2235/9607* (2013.01)

(58) Field of Classification Search
CPC ........... C04B 2237/343; H01L 21/6833; H01L 21/6831; H01L 21/68757; B32B 18/00
USPC ....................................................... 361/234
See application file for complete search history.

(56) References Cited

U.S. PATENT DOCUMENTS

| | | | |
|---|---|---|---|
| 2006/0012087 A1* | 1/2006 | Matsuda | C04B 41/89 264/619 |
| 2008/0006204 A1 | 1/2008 | Rusinko et al. | |
| 2008/0016684 A1 | 1/2008 | Olechnowicz et al. | |
| 2010/0053841 A1* | 3/2010 | Rusinko, Jr. | H01L 21/683 361/234 |
| 2010/0248935 A1 | 9/2010 | Teratani et al. | |
| 2013/0256297 A1 | 10/2013 | Nobori et al. | |
| 2014/0290863 A1 | 10/2014 | Watanabe et al. | |
| 2017/0057875 A1 | 3/2017 | Ishizuka et al. | |
| 2017/0117175 A1* | 4/2017 | Katsuda | C04B 37/006 |
| 2019/0292105 A1 | 9/2019 | Yagi et al. | |

FOREIGN PATENT DOCUMENTS

| | | | |
|---|---|---|---|
| JP | 2008-016795 A | 1/2008 | |
| JP | 2011-168472 A | 9/2011 | |
| JP | 2013-229310 A | 11/2013 | |
| KR | 10-0648001 B1 | 11/2006 | |
| KR | 648001 B1 * | 11/2006 | |
| TW | 392277 B | 6/2000 | |
| TW | 201622998 A | 7/2016 | |
| TW | 202003423 A | 1/2020 | |
| WO | 2013/054806 A1 | 4/2013 | |
| WO | WO-2018189216 A1 * | 10/2018 | B01J 21/04 |

OTHER PUBLICATIONS

Taiwanese Patent Gazette dated Aug. 1, 2022 (Application No. 1773497).
Chinese Office Action (with English translation) dated Aug. 8, 2022 (Application No. 202111081223.1).
Japanese Office Action (with English translation), Japanese Application No. 2020-154641, dated Jan. 18, 2024 (8 pages).

* cited by examiner

US 11,926,570 B2

COMPOSITE SINTERED BODY, SEMICONDUCTOR MANUFACTURING APPARATUS MEMBER, AND METHOD OF PRODUCING COMPOSITE SINTERED BODY

CROSS-REFERENCE TO RELATED APPLICATION

This application claims priority benefit of Japanese Patent Application No. 2020-154641 filed In the Japan Patent Office on Sep. 15, 2020, the entire disclosure of which is incorporated herein by reference.

The present invention relates to a composite sintered body, a semiconductor manufacturing apparatus member, and a method of producing a composite sintered body.

BACKGROUND ART

Apparatuses or the like for manufacturing semiconductor substrates conventionally use an electrostatic chuck that holds a semiconductor substrate by adsorption, a heater that heats a semiconductor substrate, and a susceptor such as an electrostatic chuck heater obtained by combining such an electrostatic chuck and such a heater. The susceptor includes a base material that contains a ceramic sintered body such as alumina as a main component, and an electrode that is arranged, for example, inside the base material.

The aforementioned susceptor is formed by, for example, integrally firing the base material and the electrode. During the firing, a difference in thermal expansion coefficient between the base material and the electrode may adversely affect the susceptor. For example, cracks may occur in the base material, or the electrode may be delaminated from the base material.

In view of this, Japanese Patent Application Laid-Open No. 2005-343733 (Document 1) proposes a technique for improving adhesion of an alumina sintered body serving as a base material to an electrode, which is fired together with the base material, by forming the electrode from a material obtained by adding 5% to 30% by weight of alumina (i.e., a base material component) to a main component such as WC that has a high-melting point.

Japanese Patent Application Laid-Open No. 2011-168472 (Document 2) proposes a sintered body that contains a base material of alumina with $MgF_2$ or other additives, and an electrode that contains WC as a main component and contains Ni, Co, and alumina as additives. The addition of alumina to the electrode is for the purpose of improving adhesion of the base material to the electrode as described above. The addition of Ni and Co to the electrode is for the purpose of improving the sinterability of the electrode at firing temperatures (e.g., from 1120° C. to 1300° C.) that are set lower by the addition of $MgF_2$.

Meanwhile, Japanese Patent Application Laid-Open No. 2013-229310 (Document 3) proposes a ceramic heater that includes a base material containing alumina as a main component, and an electrode containing Mo as a main component, instead of WC described above. In this electrode, a Ti—Al—Mg—O composite oxide is dispersed in Mo in order to improve a reverse phenomenon of temperature dependence of resistivity.

According to Documents 1 and 2, the difference in thermal expansion coefficient between the electrode and the base material is reduced to some degree by adding a base component to the electrode containing WC as a main component, but there is a limit to the reduction of the difference in thermal expansion coefficient.

The susceptor requires an alumina material for use as a base material to have properties such as high resistivity, high dielectric voltage, and a low risk of generating particles This requires an increase in the degree of purity of the aluminum material and consequently raises firing temperature (e.g., up to 1500° C. or higher) at the time of manufacturing the susceptor. Thus, if WC is used as the electrode material as in Documents 1 and 2, part of WC is oxidized into $W_2C$ due to high-temperature firing and may result in fluctuations in WC and $W_2C$ and instable electrode characteristics (e.g., resistivity and thermal expansion coefficient). Besides, a CO gas generated during the oxidation of WC may produce pores around the electrode and reduce dielectric strength of the base material.

In Document 2, it is difficult to maintain the shape of the electrode during high-temperature firing at 1500° C. or higher because Ni and Co contained in the electrode have relatively low melting points. Moreover, when the electrode is used as an electrostatic chuck, Ni and Co may inhibit adsorptive power caused by the Coulomb force because Ni and Co are magnetic materials.

Meanwhile, in Document 3, the difference in thermal expansion coefficient between the electrode and the base material may be reduced to some extent with the presence of the Ti—Al—Mg—O composite oxide. However, the Ti—Al—Mg—O composite oxide may fail to stabilize electrode characteristics (e.g., resistivity and thermal expansion coefficient) because of its unstable production that depends on reactions during firing. Moreover, stable control of the electrode characteristics may be difficult because the Ti—Al—Mg—O composite oxide in the electrode is coarse and has an uneven distribution.

SUMMARY OF INVENTION

The present invention is intended for a composite sintered body, and it is an object of the present invention to reduce a difference in thermal expansion coefficient between an electrode and a base material while suppressing an increase in resistivity of the electrode.

A composite sintered body according to one preferable embodiment of the present invention includes a base material containing ceramic as a main component, and an electrode arranged inside the base material or on a surface of the base material. The electrode contains tungsten and zirconium oxide.

This composite sintered body achieves a reduction of a difference in thermal expansion coefficient between the electrode and the base material while suppressing an increase in the resistivity of the electrode.

Preferably, an absolute value of the difference in thermal expansion coefficient between the electrode and the base material is less than or equal to 0.5 ppm/° C. within a range of temperatures higher than or equal to 40° C. and lower than or equal to 1000° C.

Preferably, the electrode has a resistivity lower than or equal to $3.5 \times 10^{-5}$ Ω·cm at a room temperature.

Preferably, the electrode has an intensity ratio of main peaks of the tungsten and the zirconium oxide higher than or equal to 0.90 and lower than 0.96, the intensity ratio being obtained by an X-ray diffraction method.

Preferably, a total content of the tungsten and zirconium oxide in the electrode is 100% by volume.

Preferably, the zirconium oxide has a sintered particle diameter greater than or equal to 0.7 μm and less than or equal to 3.0 μm.

Preferably, an absolute value of a difference in sintered particle diameter between the zirconium oxide and the tungsten is less than or equal to 0.5 μm.

Preferably, the main component of the base material is aluminum oxide, and the base material contains 95% by mass or more of the aluminum oxide.

The present invention is also intended for a semiconductor manufacturing apparatus member for use in a semiconductor manufacturing apparatus. The semiconductor manufacturing apparatus member is produced using the composite sintered body described above. The base material has a disk-like shape and has a main surface on which a semiconductor substrate is arranged.

The present invention is also intended for a method of producing a composite sintered body. The method of producing a composite sintered body includes a) preparing a first member and a second member that are one of a green body, a calcined body, and a sintered body and that contains ceramic as a main component, b) arranging an electrode that contains tungsten and zirconium oxide or a precursor of the electrode on the first member and laminating the second member on the first member to form a laminate, and c) firing the laminate by hot pressing.

Preferably, an absolute value of the difference in thermal expansion coefficient between the electrode and each of the first member and the second member after completion of the step c) is less than or equal to 0.5 ppm/° C. within a range of temperatures higher than or equal to 40° C. and lower than or equal to 1000° C.

Preferably, a firing temperature in the step c) is higher than or equal to 1550° C. and lower than or equal to 1650° C.

These and other objects, features, aspects and advantages of the present invention will become more apparent from the following detailed description of the present invention when taken in conjunction with the accompanying drawings

DESCRIPTION OF EMBODIMENT

Figure 1:
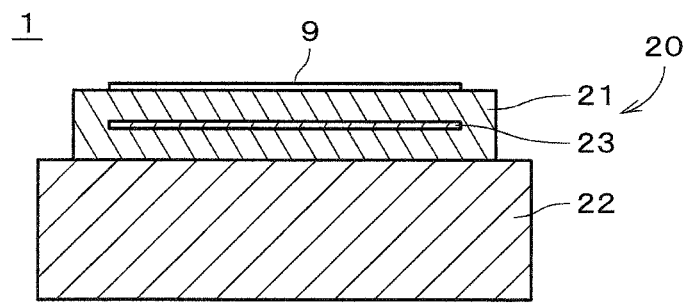
FIG. 1 is a sectional view of a susceptor according to one embodiment.

FIG. 1 is a sectional view of a susceptor 1 according to one embodiment of the present invention. The susceptor 1 is a semiconductor manufacturing apparatus member for use in a semiconductor manufacturing apparatus. The susceptor 1 supports a generally disk-like semiconductor substrate 9 (hereinafter, also simply referred to as a "substrate 9") from the underside in FIG. 1. In the following description, the upper and lower sides in FIG. 1 are simply referred to the "upper and lower sides." The up-down direction in FIG. 1 is also simply referred to as the "up-down direction". The up-down direction in FIG. 1 does not necessarily have to agree with an actual up-down direction when the susceptor 1 is installed in the semiconductor manufacturing apparatus.

The susceptor 1 includes a main body 21, a base 22, and an electrode 23. The main body 21 is a generally plate-like (e.g., generally disk-like) base material that contains ceramic as a main component. The main body 21 has an upper main surface (i.e., upper surface) on which a substrate 9 is arranged. The base 22 is a generally plate-like (e.g., generally disk-like) member larger than the main body 21 in plan view. The main body 21 is mounted on the base 22. In the example illustrated in FIG. 1, the electrode 23 is arranged inside (i.e., embedded in) the main body 21. For example, the electrode 23 is a generally band-like member having a predetermined pattern in plan view. The electrode 23 is preferably formed of a material having a relatively high melting point. The main body 21 and the electrode 23 constitute a composite sintered body formed of a plurality of materials. In the following description, the main body 21 and the electrode 23 may also be referred to collectively as a "composite sintered body 20." The materials for the main body 21 and the electrode 23 will be described later. Note that the shape of the electrode 23 may be modified in various ways. Alternatively, the electrode 23 may be provided on a surface of the main body 21.

In the example illustrated in FIG. 1, the susceptor 1 is a heater that heats the substrate 9 by heat generated by the application of a direct-current voltage to the electrode 23. That is, the electrode 23 is a heating resistor that heats the substrate 9. The susceptor 1 may include, in addition to the electrode 23, a chuck electrode inside the main body 21, the chuck electrode electrostatically adsorbing the substrate 9 by the Coulomb force or the Johnson-Rahbek effect. Alternatively, the electrode 23 may be used as a chuck electrode.

The main body 21 is formed of, for example, aluminum oxide ($Al_2O_3$) as a main component. The main body 21 may further contain an add-in material that is added to $Al_2O_3$, such as magnesium oxide (MgO) and/or magnesium-aluminum spinel ($MgAl_2O_4$). The content of $Al_2O_3$ serving as a main component in the main body 21 is, for example, higher than or equal to 95% by mass and lower than or equal to 100% by mass, and preferably higher than or equal to 99% by mass and lower than or equal to 100% by mass. The $Al_2O_3$ content in the main body 21 is adjusted in accordance with desired material characteristics of the main body 21. Note that the main component of the main body 21 is not limited to $Al_2O_3$, and may be any other ceramic.

The electrode 23 contains tungsten (W) and zirconium oxide ($ZrO_2$). In the present embodiment, the electrode 23 is substantially formed of only W and $ZrO_2$ and substantially does not contain substances other than W and $ZrO_2$. In other words, the total content of W and $ZrO_2$ in the electrode 23 is 100% by volume in the present embodiment.

The contents of W and $ZrO_2$ in the electrode 23 are adjusted so that a difference in thermal expansion coefficient between the electrode 23 and the main body 21 substantially approaches zero. In the electrode 23, an intensity ratio of main peaks of W and $ZrO_2$ (hereinafter, also referred to as an "W—$ZrO_2$ peak ratio"), obtained by an X-ray diffraction method (XRD), is for example, higher than or equal to 0.90 and lower than 0.96 and is adjusted so that the difference in thermal expansion coefficient between the electrode 23 and the main body 21 substantially approaches zero. The W—$ZrO_2$ peak ratio is a value obtained by dividing the intensity of main peaks of W by a sum of the intensity of main peaks of W and the intensity of main peaks of $ZrO_2$.

The coefficient of thermal expansion (also referred to as a "thermal expansion coefficient") of W is 5.3 ppm/° C. (i.e., ppm/K) within a range of temperatures higher than or equal to 40° C. and lower than or equal to 1000° C. If there are no descriptions about temperature conditions, the thermal expansion coefficient in the following description refers to a thermal expansion coefficient within the range of temperatures higher than or equal 40° C. and lower than or equal to 1000° C. The thermal expansion coefficient of $ZrO_2$ is 10.5 ppm/° C. The thermal expansion coefficient of $Al_2O_3$ is 8.0 ppm/° C. The main body 21 has a varying thermal expansion coefficient depending on the type and ratio of the add-in material added to the main component of $Al_2O_3$ and has, for example, a thermal expansion coefficient ranging from 8.1 ppm/° C. to 8.3 ppm/° C.

The thermal expansion coefficient of W contained in the electrode 23 is lower than the thermal expansion coefficient of the main body 21. The thermal expansion coefficient of $ZrO_2$ contained in the electrode 23 is higher than the thermal expansion coefficient of the main body 21. An absolute value of the difference in thermal expansion coefficient between the electrode 23 and the main body 21 (hereinafter, also referred to as a "CTE difference") within the range of temperatures higher than or equal to 40° C. and lower than or equal to 1000° C. is, for example, less than or equal to 0.5 ppm/° C. and preferably less than or equal to 0.2 ppm/° C. There are no particular limitations on the lower limit to the CTE difference, but the CTE difference may, for example, be greater than or equal to 0.0 ppm/° C.

The electrode 23 has, for example, a resistivity lower than or equal to $3.5 \times 10^{-5}$ Ω·cm and preferably lower than or equal to $3.0 \times 10^{-5}$ Ω·cm at a room temperature. There are no particular limitations on the lower limit to the resistivity, but the resistivity may, for example, be higher than or equal to $1.0 \times 10^{-5}$ Ω·cm.

As will be described later, the electrode 23 is a sintered body formed by firing together with or separately from the main body 21. The firing temperature is high and higher than or equal to 1500° C. Note that the melting point of W is 3410° C. and the melting point of $ZrO_2$ is 2715° C. The sintered particle diameter of W is, for example, greater than or equal to 0.7 μm and less than or equal to 3.0 μm and preferably greater than or equal to 1.0 μm and less than or equal to 2.0 μm. The sintered particle diameter of $ZrO_2$ is, for example, greater than or equal to 0.7 μm and less than or equal to 3.0 μm and preferably greater than or equal to 1.0 μm and less than or equal to 2.0 μm. An absolute value of the difference in sintered particle diameter between $ZrO_2$ and W (hereinafter, also simply referred to as a "difference in sintered particle diameter") is, for example, less than or equal to 0.5 μm and preferably less than or equal to 0.25 μm. There are no particular limitations on the lower limit to the difference in sintered particle diameter, but the difference in sintered particle diameter may, for example, be greater than or equal to 0.0 μm. The sintered particle diameters of W and $ZrO_2$ may be obtained by microstructure observation using a scanning electron microscope (SEM) or other equipment.

Figure 2:
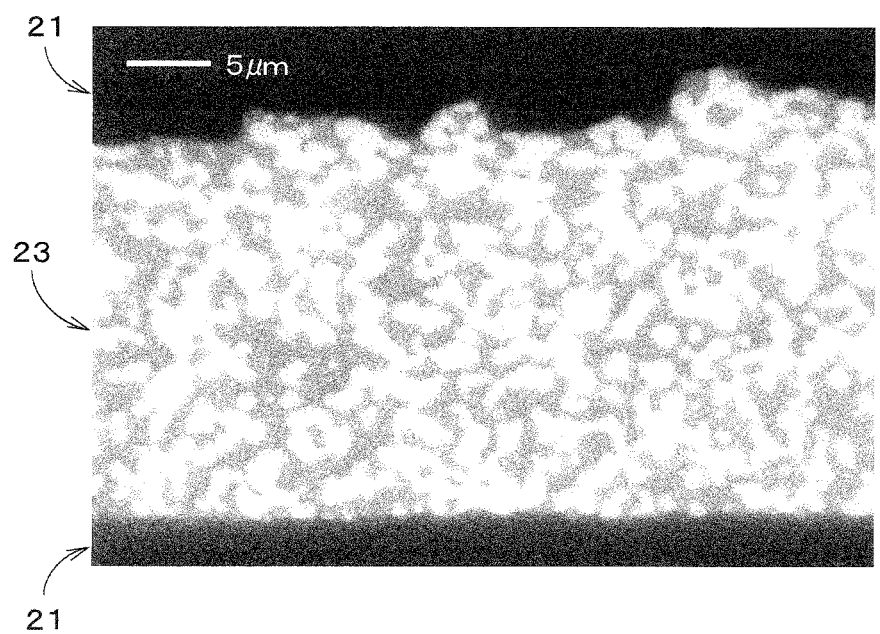
FIG. 2 is an illustration of a sectional SEM image of a composite sintered body.

FIG. 2 is an illustration of a sectional SEM image of the composite sintered body 20 according to Example 10, which will be described later. In FIG. 2, a whitish region in the central portion in the up-down direction corresponds to the electrode 23. A black band-like region on the lower side of the electrode 23 corresponds to the first member of the main body 21, and a black band-like region on the upper side of the electrode 23 corresponds to the second member of the main body 21. In the region corresponding to the electrode 23, a lightest white region corresponds to W, and a gray region darker than the region of W corresponds to $ZrO_2$. The composite sintered body 20 reduces the difference in sintered particle diameter in the electrode 23 as described above so as to have improved uniformity in the distribution of W and $ZrO_2$ in the electrode 23.

Figure 3:
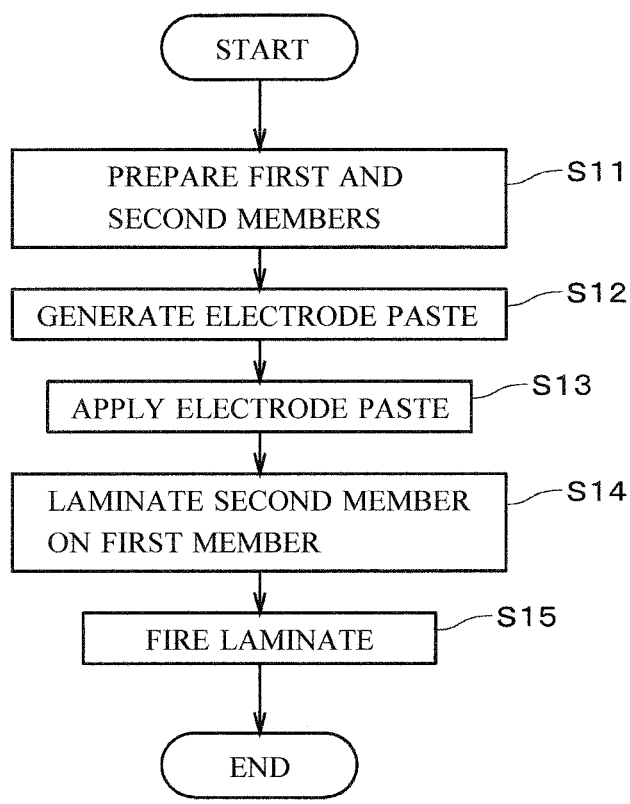
FIG. 3 is a flowchart of production of the composite sintered body.

Next is a description of one example of a method of producing the main body 21 and the electrode 23 (i.e., the composite sintered body 20) of the susceptor 1 with reference to FIG. 3. In this example, the main body 21 and the electrode 23 are produced by generating a generally disk-like lower half portion of the main body 21 (hereinafter, referred to as a "first member") and a generally disk-like upper half portion (hereinafter, referred to as a "second member") and firing the first and second members while sandwiching the material for the electrode 23 between these members.

In this production method, first, the first and second members of the main body 21 are prepared (step S11). The first and second members prepared in step S11 may be in any one form including a green body, a calcined body, and a sintered body. In step S11, first, base powder of the main body 21 (i.e., the first and second members) is weighed so as to have a predetermined composition, and the resultant base powder is subjected to wet mixing and molded by uniaxial pressure molding or other methods into a green body of a predetermined shape.

In step S11, for example, commercial high-purity particulate powder is used as the raw material for $Al_2O_3$. In the case where the main body 21 contains MgO, for example, commercial high-purity particulate powder is used as the raw material for MgO. In the case where the main body 21 contains $MgAl_2O_4$, for example, the aforementioned commercial MgO powder and the aforementioned commercial high-purity particulate powder of $Al_2O_3$ are combined by heating and used as the raw material for $MgAl_2O_4$. Alternatively, commercial high-purity particulate powder of $MgAl_2O_4$ may be used as the raw material for $MgAl_2O_4$. The degrees of purity, mean particle diameters, and other features of the raw material for $Al_2O_3$, the raw material for MgO, and the raw material for $MgAl_2O_4$ are determined appropriately.

In step S11, mixing conditions for the base powder (e.g., mixing time or solvent type) are determined appropriately. For example, an organic solvent or ion-exchanged water may be used as the solvent. Note that in step S11, the base powder may be mixed by dry mixing.

In step S11, molding conditions for the green body (e.g., pressure to be applied) are determined appropriately. In the case where the green body has a plate-like shape, a hot pressing die or the like may be filled with the base material so as to mold the green body. The molding of the green body may be implemented by any of other various methods as long the shape of the green body is kept. For example, slurry that has undergone wet mixing may be poured into a mold while being kept in a flowable state, and then solvent components may be removed from the slurry so as to form the green body of a predetermined shape. As another alternative, a tape green body of a predetermined shape may be formed by tape casting using a doctor blade or the like.

When a calcined body or a sintered body of the first and/or second members are prepared in step S11, the green body formed by the aforementioned method is fired by hot pressing or any other technique so as to form a calcined body (i.e., a temporary sintered body) or a sintered body. Firing conditions for firing of the green body (e.g., press pressure, firing temperature, and firing time) are determined appropriately. Alternatively, the green body may be fired by any other method different from hot pressing.

Next, an electrode paste serving as a precursor of the electrode 23 is generated by weighing the base powder of the electrode 23 so as to have a predetermined composition and mixing and kneaded the base powder with, for example, a solvent and a binder (step S12). In step S12, for example, commercial high-purity particulate powder is used as the raw materials for W and $ZrO_2$. The degrees of purity, mean particle diameters, and other features of the raw material for W and the raw material for $ZrO_2$ are determined appropriately. For example, the raw materials for W and $ZrO_2$ have average particle diameters less than 1 μm.

The mixing of the base powder in aforementioned electrode 23 may be implemented by, for example, wet mixing. Mixing conditions for the base powder (e.g., mixing time and solvent type) are appropriately determined. For example, an organic solvent or ion-exchanged water may be used as the solvent. Note that in step S12, the base powder may be mixed by dry mixing. In step S12, the aforementioned type of the solvent (e.g. organic solvent) and the aforementioned binder to be kneaded with the base powder are appropriately determined. Note that step S12 may be performed before step S11, or may be performed in parallel with step S11.

The electrode paste generated in step S12 is applied in a predetermined pattern by screen printing or any other technique to the upper surface of the first member formed in step S11 (step S13). When the electrode paste is applied on the green body serving as the first member in step S13, the first member may, for example, be a tape green body. Note that in step S13, any other technique different from screen printing may be used to apply the electrode paste. When a green body or a calcined body serves as the first member, the electrode paste is applied on the upper surface of the precursor of the first member. Then, the electrode paste is dried for a predetermined amount of time (e.g., one hour) in the atmosphere or any other environment, the second member is laminated on the first member and the electrode paste so as to form a laminate (step S14).

In the production of the composite sintered body 20, instead of steps S13 and S14 described above, the electrode paste generated in step S12 may be fired as a simple substance so as to form the electrode 23, the electrode 23 may be arranged on the upper surface of the first member, and the second member may be laminated on the first member and the electrode 23.

Thereafter, the laminate formed in step S14 is fired by hot pressing or any other technique so as to integrate the first and second members together and to form the main body 21 and the electrode 23 (i.e., composite sintered body 20) (step S15). Firing conditions in step S15 (e.g., press pressure, firing temperature, and firing time) are determined appropriately. The firing temperature (i.e., a maximum temperature during calcination) in step S15 may, for example, be higher than or equal to 1550° C. and lower than or equal to 1650° C. Alternatively, the laminate in step S15 may be fired by any other method different from hot pressing.

Next, Examples 1 to 13 of the composite sintered body 20 (i.e., the main body 21 and the electrode 23) according to the present invention and composite sintered bodies for use in comparison with the composite sintered body 20 according to Comparative Examples 1 to 4 will be described with reference to Tables 1 to 3. In Examples 1 to 13, the electrode 23 contains W and $ZrO_2$, whereas in Comparative Examples 1 to 4, the electrode 23 does not contain $ZrO_2$, and in Comparative Examples 1 and 2, the electrode 23 does not contain even W.

TABLE 1

| | First Member (Lower) | Second Member (Upper) | Main Component | Additional Component | Mass % | Thermal Expansion Coefficient (ppm/° C.) |
|---|---|---|---|---|---|---|
| Comparative Example 1 | Sintered Body | Green Body | $Al_2O_3$ | MgO | 0.025 | 8.1 |
| Comparative Example 2 | Sintered Body | Green Body | $Al_2O_3$ | MgO | 0.025 | 8.1 |
| Comparative Example 3 | Sintered Body | Green Body | $Al_2O_3$ | MgO | 0.025 | 8.1 |
| Comparative Example 4 | Sintered Body | Green Body | $Al_2O_3$ | MgO | 0.025 | 8.1 |
| Example 1 | Sintered Body | Green Body | $Al_2O_3$ | MgO | 0.025 | 8.1 |
| Example 2 | Sintered Body | Green Body | $Al_2O_3$ | MgO | 1 | 8.2 |
| Example 3 | Sintered Body | Green Body | $Al_2O_3$ | MgO | 5 | 8.3 |
| Example 4 | Sintered Body | Green Body | $Al_2O_3$ | MgO | 0.025 | 8.1 |
| Example 5 | Sintered Body | Green Body | $Al_2O_3$ | MgO | 0.025 | 8.1 |
| Example 6 | Sintered Body | Green Body | $Al_2O_3$ | MgO | 0.025 | 8.1 |
| Example 7 | Sintered Body | Green Body | $Al_2O_3$ | MgO | 0.025 | 8.1 |
| Example 8 | Sintered Body | Green Body | $Al_2O_3$ | MgO | 0.025 | 8.1 |
| Example 9 | Sintered Body | Green Body | $Al_2O_3$ | MgO | 0.025 | 8.1 |
| Example 10 | Sintered Body | Green Body | $Al_2O_3$ | MgO | 0.025 | 8.1 |
| Example 11 | Sintered Body | Green Body | $Al_2O_3$ | MgO | 0.025 | 8.1 |
| Example 12 | Calcined Body | Calcined Body | $Al_2O_3$ | MgO | 0.025 | 8.1 |
| Example 13 | Sintered Body | Sintered Body | $Al_2O_3$ | MgO | 0.025 | 8.1 |

TABLE 2

| | Electrode | | | | | | |
|---|---|---|---|---|---|---|---|
| | Component | | | | | | |
| | Component 1 | | | Component 2 | | | |
| | Component | Volume % | Thermal Expansion Coefficient (ppm/° C.) | Component | Volume % | Thermal Expansion Coefficient (ppm/° C.) | Thermal Expansion Coefficient (ppm/° C.) |
| Comparative Example 1 | WC | 100 | 5.3 | — | — | — | 5.3 |
| Comparative Example 2 | WC | 70.0 | 5.3 | $Al_2O_3$ | — | 8.0 | 6.1 |
| Comparative Example 3 | W | 100 | 5.3 | — | — | — | 5.3 |
| Comparative Example 4 | W | 70.0 | 5.3 | $Al_2O_3$ | — | 8.0 | 6.1 |
| Example 1 | W | 46.2 | 5.3 | $ZrO_2$ | 53.8 | 10.5 | 8.1 |
| Example 2 | W | 44.2 | 5.3 | $ZrO_2$ | 55.8 | 10.5 | 8.2 |
| Example 3 | W | 42.3 | 5.3 | $ZrO_2$ | 57.7 | 10.5 | 8.3 |
| Example 4 | W | 55.8 | 5.3 | $ZrO_2$ | 44.2 | 10.5 | 7.6 |
| Example 5 | W | 51.9 | 5.3 | $ZrO_2$ | 48.1 | 10.5 | 7.8 |
| Example 6 | W | 48.1 | 5.3 | $ZrO_2$ | 51.9 | 10.5 | 8.0 |
| Example 7 | W | 44.2 | 5.3 | $ZrO_2$ | 55.8 | 10.5 | 8.2 |
| Example 8 | W | 40.4 | 5.3 | $ZrO_2$ | 59.6 | 10.5 | 8.4 |
| Eaample 9 | W | 36.5 | 5.3 | $ZrO_2$ | 63.5 | 10.5 | 8.6 |
| Example 10 | W | 46.2 | 5.3 | $ZrO_2$ | 53.8 | 10.5 | 8.0 |
| Example 11 | W | 46.2 | 5.3 | $ZrO_2$ | 53.8 | 10.5 | 8.2 |
| Example 12 | W | 46.2 | 5.3 | $ZrO_2$ | 53.8 | 10.5 | 8.1 |
| Example 13 | W | 46.2 | 5.3 | $ZrO_2$ | 53.8 | 10.5 | 8.1 |

TABLE 3

| | Firing Temperature (° C.) | CTE Difference (ppm/° C.) | W—$ZrO_2$ Peak Ratio | Sintered Particle Diameter of W (um) | Sintered Particle Diameter of $ZrO_2$ (um) | Sintered Particle Diameter (um) | Electrode Resistivity ×10$^{-5}$ (Ω·cm) | Composition |
|---|---|---|---|---|---|---|---|---|
| Comparative Example 1 | 1600 | 2.8 | — | — | — | — | 2.0 | WC, $W_2C$ |
| Comparative Example 2 | 1600 | 2.0 | — | — | — | — | 2.7 | WC, $W_2C$ $Al_2O_3$ |
| Comparative Example 3 | 1600 | 2.5 | — | — | — | — | 0.7 | W |
| Comparative Example 4 | 1600 | 2.0 | — | — | — | — | 1.5 | W, $Al_2O_3$ |
| Example 1 | 1600 | 0.0 | 0.94 | 1.17 | 1.27 | 0.10 | 2.9 | W, $ZrO_2$ |
| Example 2 | 1600 | 0.0 | 0.93 | 1.15 | 1.32 | 0.17 | 3.0 | W, $ZrO_2$ |
| Example 3 | 1600 | 0.0 | 0.91 | 1.14 | 1.36 | 0.22 | 3.2 | W, $ZrO_2$ |
| Example 4 | 1600 | 0.5 | 0.96 | 1.20 | 1.11 | 0.09 | 2.0 | W, $ZrO_2$ |
| Example 5 | 1600 | 0.3 | 0.95 | 1.19 | 1.14 | 0.05 | 2.5 | W, $ZrO_2$ |
| Example 6 | 1600 | 0.1 | 0.95 | 1.18 | 1.22 | 0.04 | 2.8 | W, $ZrO_2$ |
| Example 7 | 1600 | 0.1 | 0.93 | 1.16 | 1.30 | 0.14 | 3.1 | W, $ZrO_2$ |
| Example 8 | 1600 | 0.3 | 0.91 | 1.14 | 1.35 | 0.21 | 3.3 | W, $ZrO_2$ |
| Example 9 | 1600 | 0.5 | 0.90 | 1.13 | 1.38 | 0.25 | 3.5 | W, $ZrO_2$ |
| Example 10 | 1550 | 0.1 | 0.94 | 0.94 | 0.82 | 0.12 | 3.0 | W, $ZrO_2$ |
| Example 11 | 1650 | 0.1 | 0.93 | 1.81 | 1.72 | 0.09 | 3.1 | W, $ZrO_2$ |
| Example 12 | 1600 | 0.0 | 0.93 | 2.22 | 2.55 | 0.33 | 2.8 | W, $ZrO_2$ |
| Example 13 | 1600 | 0.0 | 0.94 | 1.15 | 1.25 | 0.10 | 2.9 | W, $ZrO_2$ |

In Examples 1 to 13 and Comparative Examples 1 to 4, the main body 21 and the electrode 23 were produced in accordance with steps S111 to S115 described above. In Examples 1 to 13 and Comparative Examples 1 to 4, MgO was used as an additive to $Al_2O_3$ in step S11. As the raw material for $Al_2O_3$, commercial high-purity particulate powder of $Al_2O_3$ (with the degree of purity higher than or equal to 99.99% and an average particle diameter of 0.5 μm) was used. As the raw material for MgO, commercial high-purity particulate powder of MgO (with the degree of purity higher than or equal to 99.9% and an average particle diameter less than or equal to 1 μm) was used.

In Examples 1 to 13 and Comparative Examples 1 to 4, the wet mixing of the base powder in step S11 was conducted in a ball mill using an alumina ball and a poly pot. The mixing time was 20 hours, and an organic solvent was used as the solvent. Slurry generated by the wet mixing was dried and then put through a sieve to obtain the base powder of the main body 21. In step S11, the green body was molded by filling a mold for uniaxial pressure molding with the base powder. The pressure during the uniaxial pressure molding was 100 kgf/cm². A resultant green body had a generally disk-like shape with a diameter of 50 mm and a thickness of 10 mm. Note that in Examples 1 to 13 and Comparative Examples 1 to 4, a test specimen smaller than an actual composite sintered body 20 was used.

In Examples 1 to 13 and Comparative Examples 1 to 4, commercial high-purity particulate powder of W (with the degree of purity higher than or equal to 99.9% and an average particle diameter of 0.8 μm) was used as the raw material for W, and high-purity particulate powder of $ZrO_2$ (with the degree of purity higher than or equal to 99% and an average particle diameter of 0.4 μm) was used as the raw material for $ZrO_2$.

In Examples 1 to 13 and Comparative Examples 1 to 4, the wet mixing of the base powder in step S12 was conducted by a ball mill using an alumina ball and a poly pot. The mixing time was 20 hours, and an organic solvent was used as the solvent. Slurry generated by the wet mixing was dried and put through a sieve so as to obtain the base powder for the electrode 23. Also, butyl cabriole and poly-n-butyl methacrylate were used respectively as a solvent and a binder that are kneaded with the base powder during the generation of the electrode paste.

In Examples 1 to 13 and Comparative Examples 1 to 4, the application of the electrode paste in step S13 was implemented by screen printing. The electrode paste applied on the first member had a generally rectangular shape with a width of 5 mm and a length of 15 mm. The electrode paste had a thickness of 60 μm to 70 μm.

In Examples 1 to 13 and Comparative Examples 1 to 4, one of a green body, a calcined body, and a sintered body was used as each of the first and second members in steps S13 and S14. When a green body was used as the first or second member, a resultant substance obtained in step S11 described above was used.

When a calcined body was used as the first or second member, a green body was generated by a method similar to that used to prepare the aforementioned green body, and a resultant green body was subjected to heat treatment. The firing temperature (i.e., maximum temperature during heat treatment) was higher than or equal to 800° C. and lower than or equal to 1000° C. Then, a resultant calcined body was processed into a generally disk-like plate with a diameter of 50 mm and a thickness of 5 mm. Note that any known method may be adopted appropriately for the generation of the calcined body, e.g., a green body with a shape retained by addition of a forming additive such as an organic binder may be generated by heat treatment. Conditions for the generation are not limited to the conditions described above.

When a sintered body was used as the first or second member, the green body was fired by hot pressing. Specifically, the aforementioned green body was housed in a graphite hot press and set in a hot press furnace for firing. The press pressure during calcination was 200 kgf/cm². The firing temperature (i.e., maximum temperature during calcination) was higher than or equal to 1550° C. and lower than or equal to 1650° C. The firing time was eight hours. The rate of temperature rise and the rate of temperature fall were 300° C./h. The firing atmosphere was created by generating a vacuum during a temperature rise up to 1000° C. and then introducing a nitrogen gas. The gas pressure after the introduction of the nitrogen gas was maintained at approximately 1.5 atm (at approximately 0.152 MPa). During a temperature fall, temperature control was stopped at 1400° C., and the furnace was cooled. Then, a resultant sintered body was processed into a generally disk-like shape with a diameter of 50 mm and a thickness of 5 mm.

In Examples 1 to 13 and Comparative Examples 1 to 4, the firing after the lamination in step S15 was conducted by hot pressing. Specifically, the aforementioned laminate was housed in a graphite for hot pressing and set in a hot pressing furnace for firing. The press pressure during firing was 200 kgf/cm². The firing temperature (i.e., maximum temperature during firing) was higher than or equal to 1550° C. and lower than or equal to 1650° C. The firing time was in the range of four to eight hours. The rate of temperature rise and the rate of temperature fall were 300° C./h. The firing atmosphere was a nitrogen gas atmosphere.

In Tables 1 to 3, the thermal expansion coefficient of the base material (i.e., the first and second members of the main body 21) was measured at temperatures of 40° C. to 1000° C. by a method in conformity with JIS-R1618 and using a sintered body specimen that is cut out of the main body 21.

In Examples 1 to 13, the thermal expansion coefficient of the electrode 23 was obtained based on the thermal expansion coefficients of W and $ZrO_2$, each serving as a single substance, and the contents of W and $ZrO_2$ in the electrode 23. Specifically, a sum of the product of the thermal expansion coefficient of W serving as a simple substance and the W content (% by volume) in the electrode 23 and the product of the thermal expansion coefficient of $ZrO_2$ serving as a simple substance and the $ZrO_2$ content (% by volume) in the electrode 23 was obtained as the thermal expansion coefficient of the electrode 23. The thermal expansion coefficients of W and $ZrO_2$, each serving as a simple substance, were measured at temperatures of 40° C. to 1000° C. by a method in conformity with JIS-R1618 and using a bulk material generated by firing the commercial W powder and the commercial $ZrO_2$ powder used in step S12 by hot pressing under the same conditions as in step S11. The same was applied to Comparative Examples 1 to 4. As described above, the CTE difference was the absolute value of the difference in thermal expansion coefficient between the electrode 23 and the main body 21.

The W—$ZrO_2$ peak ratio in the electrode 23 was the intensity ratio of main peaks of W and $ZrO_2$ measured by aforementioned XRD. The W—$ZrO_2$ peak ratio was calculated from $I1/(I1+I2)$, where $I1$ was the intensity of the (110) plane as a main peak of W and $I2$ was the intensity of the (111) plane as a main peak of $ZrO_2$. In the measurement with the XRD, the second member was removed, and the electrode 23 located on the first member was exposed. As the X-ray diffractometer, sealed-tube X-ray diffractometer (D8-ADVANCE manufactured by Bruker AXS Inc.) was used. Measurement conditions were CuKα, 40 kV, 40 mA, and 2θ=100 to 70°, and the step width was set to 0.002°.

The sintered particle diameter of W in the electrode 23 was obtained by microstructure observation using an SEM. Specifically, one surface of a test specimen was polished into a mirror-finished surface, and the polished surface of the electrode 23 was observed with the SEM. Then, an average of the major and minor axes of each of a predetermined number of (e.g., several tens of) sintered particles, i.e., a mean diameter, was calculated, and an arithmetical mean of the average diameters of the predetermined number of sintered particles was obtained as the sintered particle diameter of W. The same applied to the sintered particle diameter of $ZrO_2$ in the electrode 23.

The resistivity of the electrode 23 was obtained as follows. First, a test specimen of a generally rectangular parallelepiped with a width of 9 mm, a length of 9 mm, and a thickness of 9 mm was cut out of the composite sintered body 20 formed in step S15. The test specimen was cut out so as to include the electrode 23 with a width of 5 mm and a length of 9 mm in the central portion. The electrode 23 with a width of 5 mm was exposed on both end faces of the test specimen. The cross-sectional area S (cm$^2$) of the electrode 23 was obtained by measuring the width and length of the electrode 23 at the end faces of the test specimen with an optical microscope. Moreover, the distance between both of the end faces of the test specimen that exposed the electrode 23 was measured with a vernier caliper and defined as a length L (cm) of the electrode 23. A circuit for resistance measurement was configured by applying a conductive paste to both of the end faces of the electrode 23 and connecting leads thereto. Then, a microcurrent I (mA) of 0 mA to 150 mA was applied to the electrode 23 at the room temperature in the atmosphere, and a micro-voltage value V (mV) generated at that time was measured to obtain resistance R ($\Omega$) of the electrode 23 from R=V/I. Thereafter, the resistivity $\rho$ ($\Omega \cdot$cm) of the electrode 23 was obtained from $\rho$=R×S/L.

The composition of the electrode 23 was obtained as follows. First, the upper or lower half of the test specimen was removed to expose the upper or lower surface of the electrode 23, and the exposed electrode 23 was polished. Then, a crystalline phase on the polished surface of the electrode 23 is identified under the above-described measurement conditions by the aforementioned X-ray diffractometer.

In Examples 1 to 13 and Comparative Examples 1 to 4, the main component of the main body 21 was $Al_2O_3$, and the additive was MgO. As described above, in Examples 1 to 13, the electrode 23 was formed of W and $ZrO_2$. In other words, in Examples 1 to 13, the total content of W and $ZrO_2$ in the electrode 23 was 100% by volume. On the other hand, in Comparative Example 1, the electrode 23 was formed of only tungsten carbide (WC) and contained neither W nor $ZrO_2$. In Comparative Example 2, the electrode 23 was formed of WC and $Al_2O_3$ and contained neither W nor $ZrO_2$. In Comparative Example 3, the electrode 23 was formed of only W and did not contain $ZrO_2$. In Comparative Example 4, the electrode 23 was formed of W and $Al_2O_3$ and did not contain $ZrO_2$.

In Example 1, a sintered body served as the first member of the main body 21 to which the electrode paste was applied in step S13. Moreover, a green body served as the second member laminated on the first member in step S14. The MgO content in the main body 21 was 0.025% by mass, and the main body 21 had a thermal expansion coefficient of 8.1 ppm/° C. Note that the remaining content of the main body 21 other than MgO was $Al_2O_3$ (the same applied to the other examples and comparative examples). The W content in the electrode 23 was 46.2% by volume, and the $ZrO_2$ content in the electrode 23 was 53.8% by volume. The electrode 23 had a thermal expansion coefficient of 8.1 ppm/° C. The firing temperature (i.e., maximum temperature during firing) of the composite sintered body 20 was 1600° C.

In Example 1, the CTE difference (i.e., absolute value of the difference in thermal expansion coefficient between the electrode 23 and the main body 21 within a range of temperatures higher than or equal to 40° C. and lower than or equal to 1000° C.) was 0.0 ppm/° C. The W—$ZrO_2$ peak ratio was 0.94. The sintered particle diameters of W and $ZrO_2$ were 1.17 µm and 1.27 µm, respectively, and the difference in sintered particle diameter between $ZrO_2$ and W (i.e., absolute value of the difference in sintered particle diameter between $ZrO_2$ and W) was 0.10 µm. The electrode 23 had a resistivity of 2.9×10$^{-5}$ $\Omega \cdot$cm. The electrode 23 was composed of W and $ZrO_2$.

In Example 1, since the CTE difference was less than or equal to 0.5 ppm/° C. and small, there were no cracks in the main body 21 and no delamination of the electrode 23 caused by the difference in thermal expansion coefficient between the main body 21 and the electrode 23. The resistivity of the electrode 23 was less than or equal to 3.5×10$^{-5}$ $\Omega \cdot$cm and small. The W—$ZrO_2$ peak ratio was within an excellent range higher than or equal to 0.90 and less than 0.96. This favorably achieves both a reduction in the aforementioned difference in thermal expansion coefficient and a reduction of increase in resistivity. The sintered particle diameter of $ZrO_2$ was within an excellent range greater than or equal to 0.7 µm and less than or equal to 3.0 µm, and the difference in sintered particle diameter (i.e., the difference in sintered particle diameter between W and $ZrO_2$) was less than or equal to 0.5 µm and small. Accordingly, a generally even distribution of W and $ZrO_2$ was achieved in the electrode 23.

In Example 2, the MgO content in the main body 21 was 1.0% by mass, and the main body 21 had a thermal expansion coefficient of 8.2 ppm/° C. The W content in the electrode 23 was 44.2% by volume, and the $ZrO_2$ content in the electrode 23 was 55.8% by volume. The electrode 23 had a thermal expansion coefficient of 8.2 ppm/° C. The other conditions were the same as those in Example 1.

In Example 2, the CTE difference was 0.0 ppm/° C. The W—$ZrO_2$ peak ratio was 0.93. The sintered particle diameters of W and $ZrO_2$ were 1.15 µm and 1.32 µm, respectively, and the difference in sintered particle diameter was 0.17 µm. The resistivity of the electrode 23 was 3.0×10$^{-5}$ $\Omega \cdot$cm. The electrode 23 was composed of W and $ZrO_2$.

In Example 2, since the CTE difference was small, there were no cracks in the main body 21 and no delamination of the electrode 23 caused by the difference in thermal expansion coefficient between the main body 21 and the electrode 23. The electrode 23 also had a low resistivity. Moreover, the sintered particle diameter of $ZrO_2$ was within an excellent range, and there was a small difference in sintered particle diameter. Accordingly, a generally even distribution of W and $ZrO_2$ was achieved in the electrode 23.

In Example 3, the MgO content in the main body 21 was 5.0% by mass, and the main body 21 had a thermal expansion coefficient of 8.3 ppm/° C. The W content in the electrode 23 was 42.3% by volume, and the $ZrO_2$ content in the electrode 23 was 57.7% by volume. The electrode 23 had a thermal expansion coefficient of 8.3 ppm/° C. The other conditions were the same as those in Example 1.

In Example 3, the CTE difference was 0.0 ppm/° C. The W—$ZrO_2$ peak ratio was 0.91. The sintered particle diameters of W and $ZrO_2$ were 1.14 µm and 1.36 µm, respectively, and the difference in sintered particle diameter was 0.22 µm. The electrode 23 had a resistivity of 3.2×10$^{-5}$ $\Omega \cdot$cm. The electrode 23 was composed of W and $ZrO_2$.

In Example 3, since the CTE difference was small, there were no cracks in the main body 21 and no delamination of the electrode 23 caused by the difference in thermal expansion coefficient between the main body 21 and the electrode 23. The electrode 23 also had a low resistivity. Moreover, since the sintered particle diameter of $ZrO_2$ was within an excellent range and the difference in sintered particle diameter was small. Accordingly, a generally even distribution of W and $ZrO_2$ was achieved in the electrode 23.

Focusing on Examples 1 to 3, even if the thermal expansion coefficient of the main body 21 varied within the above-described range (i.e., from 8.1 ppm/° C. to 8.3 ppm/° C.), the CTE difference was 0.0 ppm/° C. This prevents the occurrence of cracks in the main body 21 and delamination of the electrode 23. It was also possible to suppress an increase in the resistivity of the electrode 23.

In Example 4, the W content in the electrode 23 was 55.8% by volume, and the $ZrO_2$ content in the electrode 23 was 44.2% by volume. The electrode 23 had a thermal expansion coefficient of 7.6 ppm/° C. The other conditions were the same as those in Example 1.

In Example 4, the CTE difference was 0.5 ppm/° C. The W—$ZrO_2$ peak ratio was 0.96. The sintered particle diameters of W and $ZrO_2$ were 1.20 μm and 1.11 μm, respectively, and the difference in sintered particle diameter was 0.09 μm. The electrode 23 had a resistivity of $2.0 \times 10^{-5}$ Ω·cm. The electrode 23 was composed of W and $ZrO_2$.

In Example 4, since the CTE difference was small (i.e., less than or equal to 0.5 ppm/° C.), there were no cracks in the main body 21 and no delamination of the electrode 23 caused by the difference in thermal expansion coefficient between the main body 21 and the electrode 23. The electrode 23 also had a low resistivity. Moreover, the sintered particle diameter of $ZrO_2$ was within an excellent range, and the difference in sintered particle diameter was small. Accordingly, a generally even distribution of W and $ZrO_2$ was achieved in the electrode 23.

In Example 5, the W content in the electrode 23 was 51.9% by volume, and the $ZrO_2$ content in the electrode 23 was 48.1% by volume. The electrode 23 had a thermal expansion coefficient of 7.8 ppm/° C. The other conditions were the same as those in Example 1.

In Example 5, the CTE difference was 0.3 ppm/° C. The W—$ZrO_2$ peak ratio was 0.95. The sintered particle diameters of W and $ZrO_2$ were 1.19 μm and 1.14 μm, respectively, and the difference in sintered particle diameter was 0.05 μm. The electrode 23 had a resistivity of $2.5 \times 10^{-5}$ Ω·cm. The electrode 23 was composed of W and $ZrO_2$.

In Example 5, since the CTE difference was small, there were no cracks in the main body 21 and no delamination of the electrode 23 caused by the difference in thermal expansion coefficient between the main body 21 and the electrode 23. The electrode 23 also had a low resistivity. Moreover, since the sintered particle diameter of $ZrO_2$ was within an excellent range and the difference in sintered particle diameter was small, a generally even distribution of W and $ZrO_2$ was achieved in the electrode 23.

In Example 6, the W content in the electrode 23 was 48.1% by volume, and the $ZrO_2$ content in the electrode 23 was 51.9% by volume. The electrode 23 had a thermal expansion coefficient of 8.0 ppm/° C. The other conditions were the same as those in Example 1.

In Example 6, the CTE difference was 0.1 ppm/° C. The W—$ZrO_2$ peak ratio was 0.95. The sintered particle diameters of W and $ZrO_2$ were 1.18 μm and 1.22 μm, respectively, and the difference in sintered particle diameter was 0.04 sm. The electrode 23 had a resistivity of $2.8 \times 10^{-5}$ Ω·cm. The electrode 23 was composed of W and $ZrO_2$.

In Example 6, since the CTE difference was small, there were no cracks in the main body 21 and no delamination of the electrode 23 caused by the difference in thermal expansion coefficient between the main body 21 and the electrode 23. The electrode 23 also had a low resistivity. Moreover, the sintered particle diameter of $ZrO_2$ was within an excellent range, and the difference in sintered particle diameter was small. Accordingly, a generally even distribution of W and $ZrO_2$ was achieved in the electrode 23.

In Example 7, the W content in the electrode 23 was 44.2% by volume, and the $ZrO_2$ content in the electrode 23 was 55.8% by volume. The electrode 23 had a thermal expansion coefficient of 8.2 ppm/° C. The other conditions were the same as those in Example 1.

In Example 7, the CTE difference was 0.1 ppm/° C. The W—$ZrO_2$ peak ratio was 0.93. The sintered particle diameters of W and $ZrO_2$ were 1.16 μm and 1.30 μm, respectively, and the difference in sintered particle diameter was 0.14 μm. The electrode 23 had a resistivity of $3.1 \times 10^{-5}$ Ω·cm. The electrode 23 was composed of W and $ZrO_2$.

In Example 7, since the CTE difference was small, there were no cracks in the main body 21 and no delamination of the electrode 23 caused by the difference in thermal expansion coefficient between the main body 21 and the electrode 23. The electrode 23 also had a low resistivity. Moreover, the sintered particle diameter of $ZrO_2$ was within an excellent range, and the difference in sintered particle diameter was small. Accordingly, a generally even distribution of W and $ZrO_2$ was achieved in the electrode 23.

In Example 8, the W content in the electrode 23 was 40.4% by volume, and the $ZrO_2$ content in the electrode 23 was 59.6% by volume. The electrode 23 had a thermal expansion coefficient of 8.4 ppm/° C. The other conditions were the same as those in Example 1.

In Example 8, the CTE difference was 0.3 ppm/° C. The W—$ZrO_2$ peak ratio was 0.91. The sintered particle diameters of W and $ZrO_2$ were 1.14 μm and 1.35 μm, respectively, and the difference in sintered particle diameter was 0.21 μm. The electrode 23 had a resistivity of $3.3 \times 10^{-5}$ Ω·cm. The electrode 23 was composed of W and $ZrO_2$.

In Example 8, since the CTE difference was small, there were no cracks in the main body 21 and no delamination of the electrode 23 caused by the difference in thermal expansion coefficient between the main body 21 and the electrode 23. The electrode 23 also had a low resistivity. Moreover, the sintered particle diameter of $ZrO_2$ was within an excellent range, and the difference in sintered particle diameter was small. Accordingly, a generally even distribution of W and $ZrO_2$ was achieved in the electrode 23.

In Example 9, the W content in the electrode 23 was 36.5% by volume, and the $ZrO_2$ content in the electrode 23 was 63.5% by volume. The electrode 23 had a thermal expansion coefficient of 8.6 ppm/° C. The other conditions were the same as those in Example 1.

In Example 9, the CTE difference was 0.5 ppm/° C. The W—$ZrO_2$ peak ratio was 0.90. The sintered particle diameters of W and $ZrO_2$ were 1.13 μm and 1.38 μm, respectively, and the difference in sintered particle diameter was 0.25 μm. The electrode 23 had a resistivity of $3.5 \times 10^{-5}$ Ω·cm. The electrode 23 was composed of W and $ZrO_2$.

In Example 9, since the CTE difference was small, there were no cracks in the main body 21 and no delamination of the electrode 23 caused by the difference in thermal expansion coefficient between the main body 21 and the electrode 23. The electrode 23 also had a low resistivity. Since the sintered particle diameter of $ZrO_2$ was within an excellent range and the difference in sintered particle diameter was small, a generally even distribution of W and $ZrO_2$ was achieved in the electrode 23.

Focusing on Examples 1 and 4 to 9, even in the case where the contents of W and $ZrO_2$ in the electrode 23 varied and the CTE difference varied within the above-described range (i.e., from 0.0 ppm/° C. to 0.5 ppm/° C.), it was possible to prevent the occurrence of cracks in the main body 21 and delamination of the electrode 23. It was also possible to suppress an increase in the resistivity of the electrode 23.

In Example 10, the firing temperature of the composite sintered body 20 was 1550° C. The other conditions were the same as those in Example 1.

In Example 10, the electrode 23 had a thermal expansion coefficient of 8.0 ppm/° C., and the CTE difference was 0.1 ppm/° C. The W—$ZrO_2$ peak ratio was 0.94. The sintered particle diameters of W and $ZrO_2$ were 0.94 μm and 0.82 μm, respectively, and the difference in sintered particle diameter was 0.12 μm. The electrode 23 had a resistivity of $3.0×10^{-5}$ Ω·cm. The electrode 23 was composed of W and $ZrO_2$.

In Example 10, since the CTE difference was small, there were no cracks in the main body 21 and no delamination of the electrode 23 caused by the difference in thermal expansion coefficient between the main body 21 and the electrode 23. The electrode 23 also had a low resistivity. Since the sintered particle diameter of $ZrO_2$ was within an excellent range and the difference in sintered particle diameter was small, a. generally even distribution of W and $ZrO_2$ was achieved in the electrode 23.

In Example 11, the firing temperature of the composite sintered body 20 was 1650° C. The other conditions were the same as those in Example 1.

In Example 11, the electrode 23 had a thermal expansion coefficient of 8.2 ppm/° C., and the CTE difference was 0.1 ppm/° C. The W—$ZrO_2$ peak ratio was 0.93. The sintered particle diameters of W and $ZrO_2$ were 1.81 μm and 1.72 μm, respectively, and the difference in sintered particle diameter was 0.09 μm. The electrode 23 had a resistivity of $3.1×10^{-5}$ Ω·cm. The electrode 23 was composed of W and $ZrO_2$.

In Example 11, since the CTE difference was small, there were no cracks in the main body 21 and no delamination of the electrode 23 caused by the difference in thermal expansion coefficient between the main body 21 and the electrode 23. The electrode 23 had a low resistivity. Moreover, since the sintered particle diameter of $ZrO_2$ was within an excellent range and the difference in sintered particle diameter was small, a generally even distribution of W and $ZrO_2$ was achieved in the electrode 23.

Focusing on Examples 1, 10, and 11, even in the case where the firing temperature of the composite sintered body 20 varied within the above-described range (i.e., from 1550° C. to 1650° C.), the CTE difference was in the range of 0.0 ppm/° C. to 0.1 ppm/° C. and small, and it was possible to prevent the occurrence of cracks in the main body 21 and delamination of the electrode 23. It was also possible to suppress an increase in the resistivity of the electrode 23.

In Example 12, calcined bodies served as the first member prepared in step S11 and the second member laminated on the first member in step S14. The other conditions were the same as those in Example 1.

In Example 12, the CTE difference was 0.0 ppm/° C. The W—$ZrO_2$ peak ratio was 0.93. The sintered particle diameters of W and $ZrO_2$ were 2.22 μm and 2.55 μm, respectively, and the difference in sintered particle diameter was 0.33 μm. The electrode 23 had a resistivity of $2.8×10^{-5}$ Ω·cm. The electrode 23 was composed of W and $ZrO_2$.

In Example 12, since the CTE difference was small, there were no cracks in the main body 21 and no delamination of the electrode 23 caused by the difference in thermal expansion coefficient between the main body 21 and the electrode 23. The electrode 23 also had a low resistivity. Moreover, since the sintered particle diameter of $ZrO_2$ was within an excellent range and the difference in sintered particle diameter was small, a generally even distribution of W and $ZrO_2$ was achieved in the electrode 23.

In Example 13, a sintered body served as the second member laminated on the first member in step S14. The other conditions were the same as those in Example 1.

In Example 13, the CTE difference was 0.0 ppm/° C. The W—$ZrO_2$ peak ratio was 0.94. The sintered particle diameters of W and $ZrO_2$ were 1.15 μm and 1.25 μm, respectively, and the difference in sintered particle diameter was 0.10 μm. The electrode 23 had a resistivity of $2.9×10^{-5}$ Ω·cm. The electrode 23 was composed of W and $ZrO_2$.

In Example 13, since the CTE difference was small, there were no cracks in the main body 21 and no delamination of the electrode 23 caused by the difference in thermal expansion coefficient between the main body 21 and the electrode 23. The electrode 23 also had a low resistivity. Moreover, since the sintered particle diameter of $ZrO_2$ was within an excellent range and the difference in sintered particle diameter was small, a generally even distribution of W and $ZrO_2$ was achieved in the electrode 23.

Focusing on Examples 1, 12, and 13, even in the case where the first and second members before sintering in step S15 varied in state (i.e., a green body, a calcined body, or a sintered body), the CTE difference was 0.0 ppm/° C., and it was possible to prevent the occurrence of cracks in the main body 21 and delamination of the electrode 23. Moreover, it is also possible to suppress an increase in the resistivity of the electrode 23.

In Comparative Example 1, the electrode 23 was formed of only WC and contained neither W nor $ZrO_2$ described above. The electrode 23 had a thermal expansion coefficient of 5.3 ppm/° C. The other conditions were the same as those in Example 1. In Comparative Example 1, since the CTE difference was 2.8 ppm/° C. and large, there were cracks in the main body 21 or delamination of the electrode 23 caused by the difference in thermal expansion coefficient between the main body 21 and the electrode 23. The electrode 23 was composed of WC and $W_2C$. The $W_2C$ was generated by oxidizing part of WC by high-temperature firing, and might vary the contents of WC and $W_2C$ in the electrode 23 and might make unstable the characteristics of the electrode 23 (e.g., resistivity or thermal expansion coefficient).

In Comparative Example 2, the electrode 23 was formed of only WC and $Al_2O_3$ and contained neither W nor $ZrO_2$. The electrode 23 had a thermal expansion coefficient of 6.1 ppm/° C. The other conditions were the same as those in Example 1. In Comparative Example 2, since the CTE difference was 2.0 ppm/° C. and large, there were cracks in the main body 21 and delamination of the electrode 23 caused by the difference in thermal expansion coefficient between the main body 21 and the electrode 23. The electrode 23 was composed of WC, $W_2C$, and $Al_2O_3$. Accordingly, the characteristics of the electrode 23 might become unstable as in Comparative Example 1.

In Comparative Example 3, the electrode 23 was formed of only W and contained no $ZrO_2$ as described above. The electrode 23 had a thermal expansion coefficient of 5.3 ppm/° C. The other conditions were the same as those in Example 1. In Comparative Example 23, since the CTE difference was 2.5 ppm/° C. and large, there were cracks in the main body 21 and delamination of the electrode 23 caused by the difference in thermal expansion coefficient between the main body 21 and the electrode 23. The electrode 23 was composed of W.

In Comparative Example 4, the electrode 23 was formed of W and $Al_2O_3$ and contained no $ZrO_2$ as described above. The electrode 23 had a thermal expansion coefficient of 6.1 ppm/° C. The other conditions were the same as those in Example 1. In Comparative Example 4, since the CTE difference was 2.0 ppm/° C. and large, there were cracks in the main body 21 and delamination of the electrode 23 caused by the difference in thermal expansion coefficient between the main body 21 and the electrode 23. The electrode 23 was composed of W and $Al_2O_3$.

As described above, the composite sintered body 20 includes the base material containing ceramic as a main component (in the above-described example, main body 21), and the electrode 23 arranged inside the base material or on the surface of the base material. The electrode 23 contains W and $ZrO_2$. This reduces the difference in thermal expansion coefficient between the electrode 23 and the base material as in Examples 1 to 13. As a result, it is possible to suppress the occurrence of cracks in the base material and delamination of the electrode 23 caused by the difference in thermal expansion coefficient between the electrode 23 and the base material. The composite sintered body 20 can also suppress an increase in the resistivity of the electrode 23. As a result, it is possible to control the heating value of the electrode 23 with high accuracy. Moreover, since W and $ZrO_2$ are not magnetic materials such as Ni and Co, even if the composite sintered body 20 is used as an electrostatic chuck, it is possible to reduce the possibility that the adsorption of the substrate 9 caused by the Coulomb force is inhibited.

As described above, the absolute value of the difference in thermal expansion coefficient between the electrode 23 and the base material is preferably less than or equal to 0.5 ppm/° C. within the range of temperatures higher than or equal to 40° C. and lower than or equal to 1000° C. This further suppresses the occurrence of cracks in the base material and delamination of the electrode 23 caused by the difference in thermal expansion coefficient between the electrode 23 and the base material.

As described above, the resistivity of the electrode 23 is preferably lower than or equal to $3.5 \times 10^{-5}$ Ω·cm at the room temperature. This further increases the accuracy of controlling the heating value of the electrode 23.

As described above, the intensity ratio of main peaks of W and $ZrO_2$ (i.e., W—$ZrO_2$ peak ratio) in the electrode 23, obtained by an X-ray diffraction method, is preferably higher than or equal to 0.90 and lower than 0.96. In this way, if the composition ratio of W and $ZrO_2$ in the electrode 23 is made within an excellent range, it is possible to favorably reduce the difference in thermal expansion coefficient between the electrode 23 and the base material while favorably suppressing an increase in the resistivity of the electrode 23.

As described above, the total content of W and $ZrO_2$ in the electrode 23 is preferably 100% by volume. This prevents an increase in production cost caused by an increase in the material type of the electrode 23.

As described above, the sintered particle diameter of $ZrO_2$ is preferably greater than or equal to 0.7 μm and less than or equal to 3.0 μm. This improves uniformity in the distribution of $ZrO_2$ in the electrode 23. As a result, it is possible to achieve both suppressing an increase in resistivity and reducing the difference in thermal expansion coefficient between the base material and the electrode 23 in the entire electrode 23.

As described above, the absolute value of the difference in sintered particle diameter between $ZrO_2$ and W (i.e., the difference in sintered particle diameter) is preferably less than or equal to 0.5 μm. This improves uniformity in the distribution of W and $ZrO_2$ in the electrode 23. As a result, it is possible achieve both suppressing an increase in resistivity and reducing the difference in thermal expansion coefficient between the base material and the electrode 23 in the entire electrode 23.

As described above, the main component of the base material is preferably $Al_2O_3$, and the $Al_2O_3$ content in the base material is preferably higher than or equal to 95% by mass. This allows high-temperature firing of the composite sintered body 20 during production of the composite sintered body 20. Accordingly, it is possible to suppress carbonization and oxidation of W during firing. As a result, it is possible to stabilize the characteristics of the electrode 23.

As described above, the composite sintered body 20 can suppress the occurrence of cracks in the base material and delamination of the electrode 23 by reducing the difference in thermal expansion coefficient between the electrode 23 and the base material while suppressing an increase in the resistivity of the electrode 23. Accordingly, the composite sintered body 20 is suitable for use as a semiconductor manufacturing apparatus member that is used in a semiconductor manufacturing apparatus. In particular, the composite sintered body 20 is suitable for use as a semiconductor manufacturing apparatus member that is used in a high-output semiconductor manufacturing apparatus such as a high-power etching device. The aforementioned susceptor 21 is one preferable example of the semiconductor manufacturing apparatus member produced using the composite sintered body 20. In the susceptor 1, as described above, the main body 21 has a disk-like shape, and the substrate 9 is arranged on the main surface of the main body 21.

The method of producing the aforementioned composite sintered body includes a step of preparing the first and second members, each containing ceramic as a main component and each being one of a green body, a calcined body, and a sintered body (step S11), a step of arranging the electrode 23 that contains W and $ZrO_2$ or a precursor of the electrode 23 on the first member, and laminating the second member to form a laminate (steps S13, S14), and a step of firing the laminate by hot pressing (step S15). As described above, this suppresses the occurrence of cracks in the base material and delamination of the electrode 23 caused by the difference in thermal expansion coefficient between the electrode 23 and the base material.

As described above, the absolute value of the difference in thermal expansion coefficient between the electrode 23 and the first member after completion of step S15 is preferably less than or equal to 0.5 ppm/° C. within the range of temperatures higher than or equal to 40° C. and lower than or equal to 1000° C. This further suppresses the occurrence of cracks in the base material and delamination of the electrode 23 caused by the difference in thermal expansion coefficient between the electrode 23 and the base material.

As described above, the firing temperature in step S15 is preferably higher than or equal to 1550° C. and lower than or equal to 1650° C. This suppresses carbonization and oxidation of W during firing. As a result, it is possible to stabilize the characteristics of the electrode 23.

The composite sintered body 20, the semiconductor manufacturing apparatus member, and the method of producing the composite sintered body 20 described above may be modified in various ways.

For example, the CTE difference in the composite sintered body 20 may be greater than 0.5 ppm/° C.

The resistivity of the electrode 23 at the room temperature may be higher than $3.5 \times 10^{-5}$ Ω·cm.

The W—$ZrO_2$ peak ratio in the electrode 23 may be less than 0.90, or may be higher than or equal to 0.96.

The total content of W and $ZrO_2$ in the solid matter of the electrode 23 may be less than 100% by volume.

The sintered particle diameter of $ZrO_2$ in the electrode 23 may be less than 0.7 μm, or may be greater than 3.0 μm.

In the electrode 23, the absolute value in sintered particle diameter between $ZrO_2$ and W (i.e., the difference in sintered particle diameter) may be greater than 0.5 μm.

The $Al_2O_3$ content in the main body 21 may be less than 95% by mass. The main component of the main body 21 may be ceramic other than $Al_2O_3$.

In the method of producing the composite sintered body 20, the firing temperature in step S15 described above may be lower than 1550° C., or may be higher than 1650° C.

The composite sintered body 20 may be produced by a method different from the above-described production method. For example, step S12 may be omitted, and the base powder of the electrode 23 (i.e., the precursor of the electrode 23) may be applied to the first member.

The composite sintered body 20 may also be used in the production of any other semiconductor manufacturing apparatus member (e.g., a ring or a shower head) provided in a semiconductor manufacturing apparatus. Alternatively, the composite sintered body 20 may be used to produce a member for use in an apparatus other than the semiconductor manufacturing apparatus. For example, the composite sintered body 20 may be used in the production of a susceptor that supports substrates other than semiconductor substrates, or may be used to produce a ceramic heater that heats a target object.

The configurations of the preferred embodiments and variations described above may be appropriately combined as long as there are no mutual inconsistencies.

While the invention has been shown and described in detail, the foregoing description is in all aspects illustrative and not restrictive. It is therefore to be understood that numerous modifications and variations can be devised without departing from the scope of the invention.

INDUSTRIAL APPLICABILITY

The present invention is applicable in fields relating to semiconductor manufacturing apparatuses such as the manufacture of susceptor that hold and heat semiconductor substrates.

REFERENCE SIGNS LIST

1 Susceptor
20 Composite sintered body
21 Main body
23 Electrode
9 Substrate
S11 to S15 Step

The invention claimed is:

1. A composite sintered body comprising:
a base material including ceramic as a main component; and
an electrode arranged inside said base material or on a surface of said base material,
wherein said electrode contains:
tungsten; and
zirconium oxide;
wherein a total content of said tungsten and said zirconium oxide in said electrode is 100% by volume; and
wherein said electrode has an intensity ratio of main peaks of said tungsten and said zirconium oxide higher than or equal to 0.90 and lower than 0.96, the intensity ratio being obtained by an X-ray diffraction method.

2. The composite sintered body according to claim 1, wherein
an absolute value of a difference in thermal expansion coefficient between said electrode and said base material is less than or equal to 0.5 ppm/° C. within a range of temperatures higher than or equal to 40° C. and lower than or equal to 1000° C.

3. The composite sintered body according to claim 1, wherein
said electrode has a resistivity lower than or equal to $3.5 \times 10^{-5}$ Ω·cm at a room temperature.

4. The composite sintered body according to claim 1, wherein
said zirconium oxide has a sintered particle diameter greater than or equal to 0.7 μm and less than or equal to 3.0 μm.

5. The composite sintered body according to claim 1, wherein
an absolute value of a difference in sintered particle diameter between said zirconium oxide and said tungsten is less than or equal to 0.5 μm.

6. The composite sintered body according to claim 1, wherein
the main component of said base material is aluminum oxide, and
said base material contains 95% by mass or more of said aluminum oxide.

7. A semiconductor manufacturing apparatus member for use in a semiconductor manufacturing apparatus,
the semiconductor manufacturing apparatus member being prepared using the composite sintered body according to claim 1,
wherein said base material has a disk-like shape and has a main surface on which a semiconductor substrate is arranged.

8. A method of producing the composite sintered body according to claim 1, comprising:
a) preparing a first member and a second member that are each one of a green body, a calcined body, and a sintered body, each including ceramic as a main component;
b) arranging an electrode that contains tungsten and zirconium oxide or a precursor of said electrode on said first member and laminating said second member on said first member to form a laminate; and
c) firing said laminate by hot pressing.

9. The method of producing a composite sintered body according to claim 8, wherein
an absolute value of a difference in thermal expansion coefficient between said electrode and each of said first member and said second member after completion of said step c) is less than or equal to 0.5 ppm/° C. within a range of temperatures higher than or equal to 40° C. and lower than or equal to 1000° C.

10. The method of producing a composite sintered body, according to claim 8, wherein
a firing temperature in said step c) is higher than or equal to 1550° C. and lower than or equal to 1650° C.

* * * * *